US006713346B2

(12) United States Patent
Wolstenholme

(10) Patent No.: US 6,713,346 B2
(45) Date of Patent: Mar. 30, 2004

(54) METHODS OF FORMING A LINE OF FLASH MEMORY CELLS

(75) Inventor: Graham Wolstenholme, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/768,878

(22) Filed: Jan. 23, 2001

(65) Prior Publication Data

US 2002/0039821 A1 Apr. 4, 2002

Related U.S. Application Data

(63) Continuation of application No. 09/260,182, filed on Mar. 1, 1999, now abandoned.

(51) Int. Cl.$^7$ .......................................... H01L 21/8247
(52) U.S. Cl. ...................................... 438/257; 438/286
(58) Field of Search ................................ 438/257–267, 438/286, 296

(56) References Cited

U.S. PATENT DOCUMENTS

| 4,698,900 | A | | 10/1987 | Esquivel | |
|---|---|---|---|---|---|
| 5,153,143 | A | | 10/1992 | Schlais et al. | 437/43 |
| 5,270,240 | A | | 12/1993 | Lee | 437/52 |
| 5,376,572 | A | | 12/1994 | Yang et al. | 437/43 |
| 5,424,233 | A | | 6/1995 | Yang et al. | 437/43 |
| 5,498,558 | A | | 3/1996 | Kapoor | 437/43 |
| 5,512,504 | A | | 4/1996 | Wolstenholme et al. | 437/43 |
| 5,552,331 | A | * | 9/1996 | Hsu et al. | 438/258 |
| 5,605,853 | A | | 2/1997 | Yoo et al. | 437/43 |
| 5,679,591 | A | | 10/1997 | Lin et al. | 437/43 |
| 5,691,246 | A | | 11/1997 | Becker et al. | 437/225 |
| 5,854,108 | A | * | 12/1998 | Hsu et al. | 438/257 |
| 5,960,276 | A | | 9/1999 | Liaw et al. | |
| 5,976,927 | A | | 11/1999 | Hsieh et al. | 438/239 |
| 5,987,573 | A | | 11/1999 | Hiraka | 711/156 |
| 6,020,229 | A | | 2/2000 | Yamane et al. | 438/201 |
| 6,037,221 | A | * | 3/2000 | Lee et al. | 438/257 |
| 6,037,223 | A | | 3/2000 | Su et al. | 438/257 |

(List continued on next page.)

OTHER PUBLICATIONS

U.S. patent application Ser. No. 09/225,983, Prall, filed Jan. 4, 1999.
U.S. patent application Ser. No. 09/516,818, Prall, filed Mar. 1, 2000.

*Primary Examiner*—Richard A. Booth
(74) *Attorney, Agent, or Firm*—Wells St. John P.S.

(57) ABSTRACT

The invention comprises FLASH memory and methods of forming flash memory. In one implementation, a line of floating gates is formed over a semiconductor substrate. The semiconductor substrate is etched to form a series of spaced trenches therein in a line adjacent and along at least a portion of the line of floating gates. At least one conductivity enhancing impurity implant is conducted into the semiconductor substrate at an angle away from normal to a general orientation of the semiconductor substrate to implant at least along sidewalls of the trenches and between the trenches, and a continuous line of source active area is formed within the semiconductor substrate along at least a portion of the line of floating gates. In another implementation, a line of floating gates is formed over a semiconductor substrate. An alternating series of trench isolation regions and active area regions are provided in the semiconductor substrate in a line adjacent and along at least a portion of the line of floating gates. The series of active areas define discrete transistor source areas separated by trench isolation regions. A conductive line is formed over the discrete transistor source areas and trench isolation regions separating same adjacent and along at least a portion of the line of floating gates. The conductive line electrically interconnects the discrete transistor source areas. Source forming conductivity enhancing impurity is provided into the discrete transistor source areas. Other implementations are contemplated.

28 Claims, 4 Drawing Sheets

U.S. PATENT DOCUMENTS

| | | | |
|---|---|---|---|
| 6,043,123 A | 3/2000 | Wang et al. | 438/258 |
| 6,074,915 A | 6/2000 | Chen et al. | 438/258 |
| 6,074,959 A | 6/2000 | Wang et al. | 438/738 |
| 6,080,624 A | 6/2000 | Kamiya et al. | 438/257 |
| 6,096,603 A | 8/2000 | Chang et al. | 438/258 |
| 6,103,574 A | 8/2000 | Iwasaki | |
| 6,149,828 A | 11/2000 | Vaarstra | 216/57 |
| 6,197,639 B1 | 3/2001 | Lee et al. | 438/258 |
| 6,232,181 B1 | 5/2001 | Lee | 438/257 |
| 6,235,581 B1 * | 5/2001 | Chen | 438/257 |
| 6,235,582 B1 | 5/2001 | Chen | 438/257 |
| 6,238,976 B1 | 5/2001 | Noble et al. | 438/259 |
| 6,245,639 B1 | 6/2001 | Tsai et al. | |
| 6,258,665 B1 | 7/2001 | Shimizu et al. | 438/257 |
| 6,277,693 B1 | 8/2001 | Chen | |
| 6,306,737 B1 | 10/2001 | Mehrad et al. | |
| 6,337,244 B1 | 1/2002 | Prall et al. | 438/257 |
| 6,406,959 B2 | 6/2002 | Prall et al. | 438/258 |
| 2002/0038884 A1 | 4/2002 | Shirota et al. | |
| 2002/0045303 A1 | 4/2002 | Lee | |
| 2003/0034511 A1 | 2/2003 | Hurley et al. | |
| 2003/0151080 A1 | 8/2003 | Hurley et al. | |

\* cited by examiner

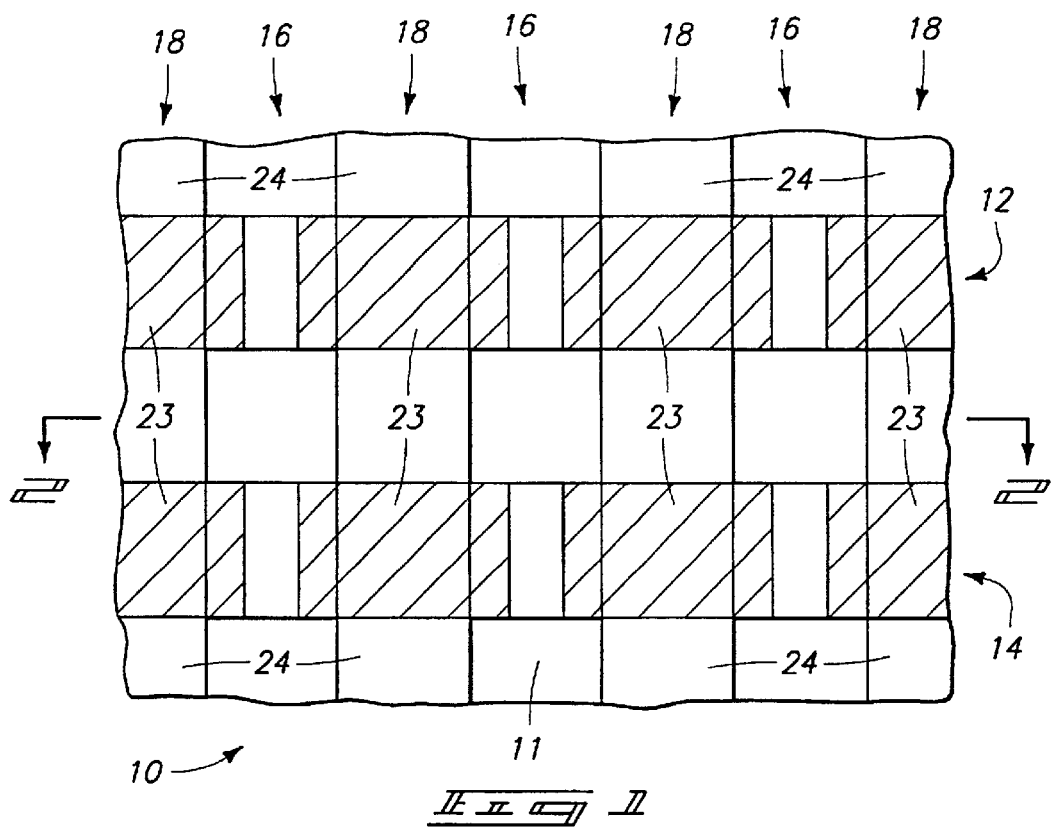
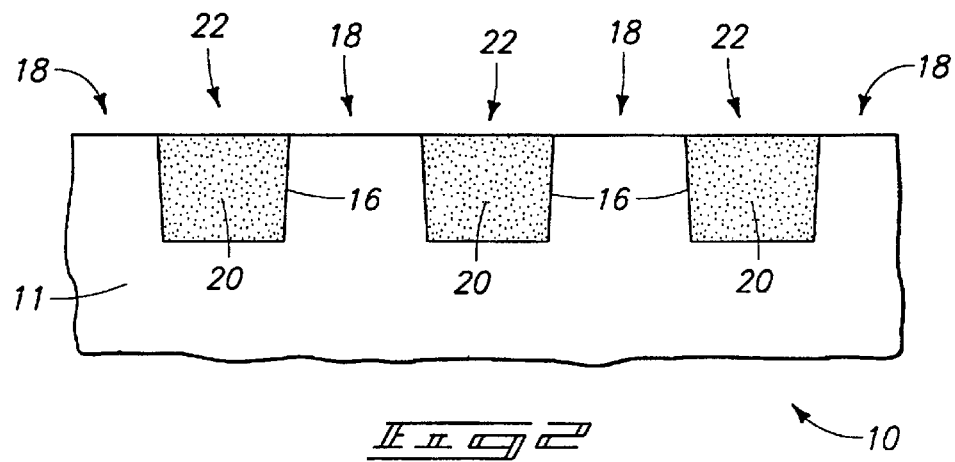

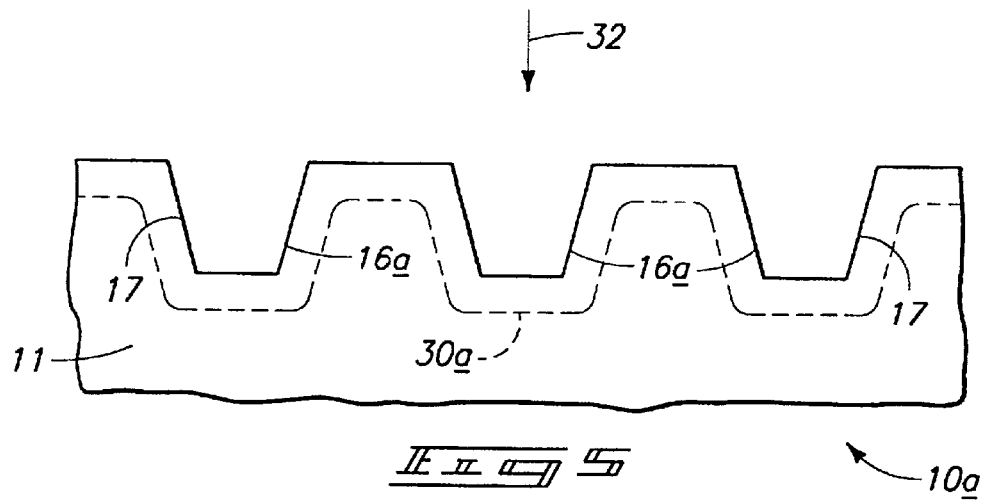
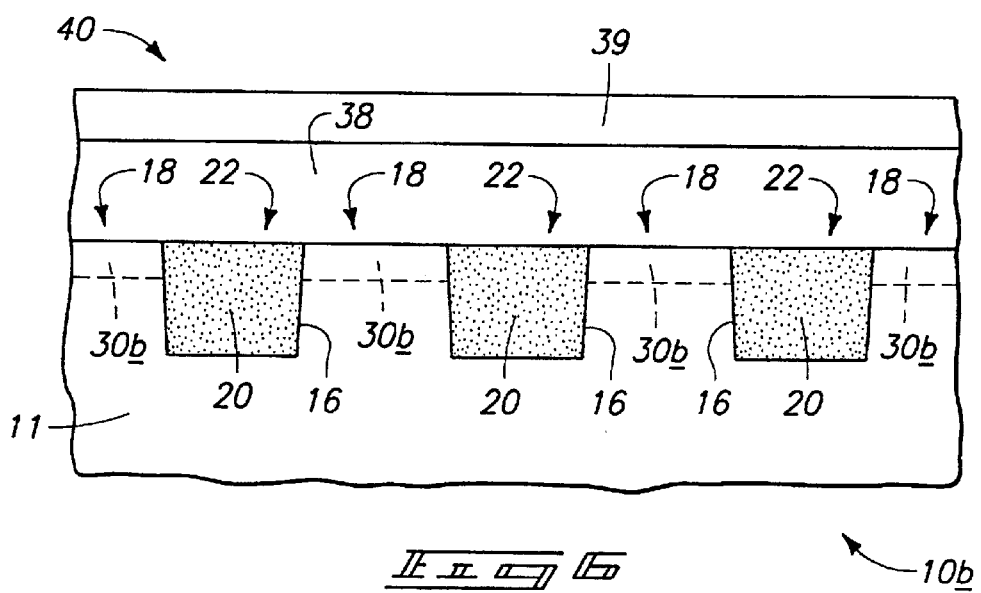

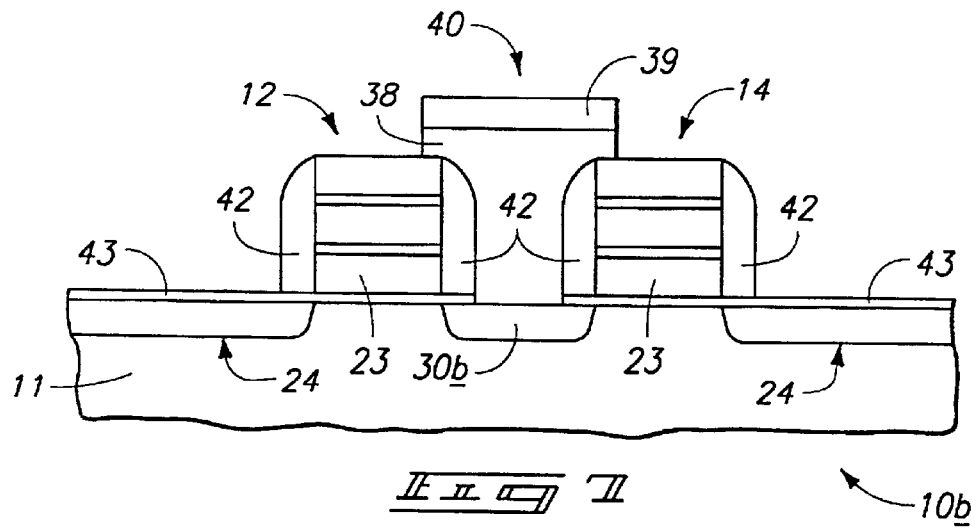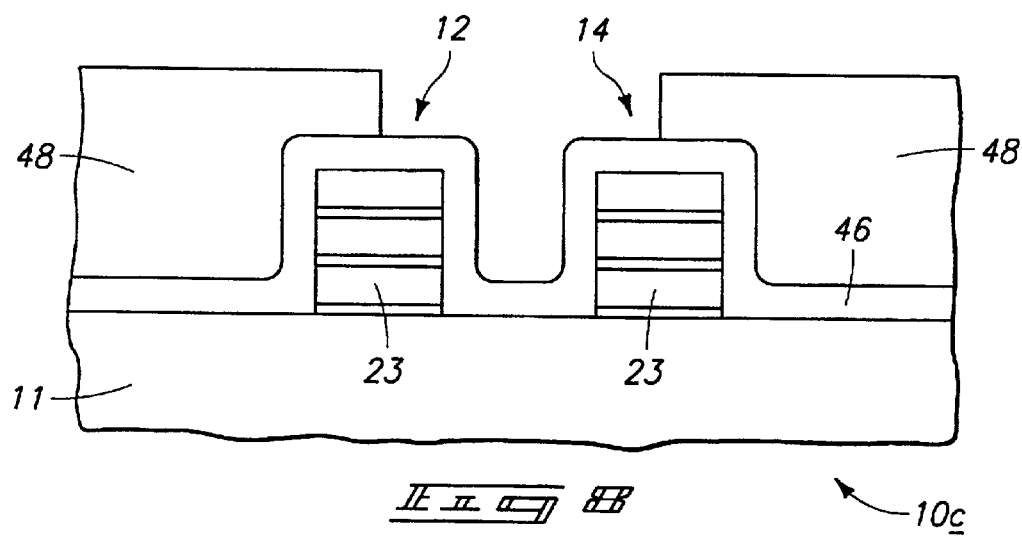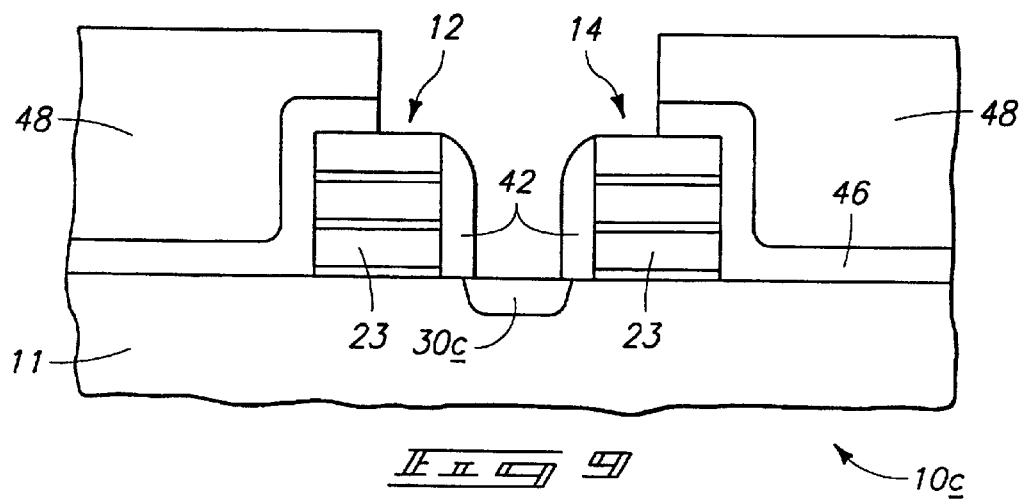

METHODS OF FORMING A LINE OF FLASH MEMORY CELLS

This patent resulted from a continuation application of U.S. patent application Ser. No. 09/260,182, filed Mar. 1, 1999 now abandoned entitled "Methods of Forming Flash Memory", naming Graham Wolstenholme as inventor, the disclosure of which is incorporated by reference.

TECHNICAL FIELD

This invention relates generally to FLASH memory and methods of forming FLASH memory.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array consisting of rows and columns. The rows are typically considered as comprising individual conductive gate lines formed as a series of spaced floating gates received along a single conductive line. Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, the source regions along a given line of floating gates are typically all provided to interconnect within the substrate in a line running parallel and immediately adjacent the line of floating gates. These regions of continuously running source area are interconnected outside of the array, and strapped to a suitable connection for providing the desired potential relative to all the sources within the array. Accordingly, prior art techniques have been utilized to form a line of continuously running implanted source material within the semiconductor substrate and running parallel with the floating gate word lines.

In a principal technique of achieving the same, the substrate has first been fabricated to form field oxide regions by LOCOS. The fabrication forms alternating strips of active area and LOCOS field oxide running substantially perpendicular to the floating gate word lines which will be subsequently formed. Thus running immediately adjacent and parallel with the respective word lines will be an alternating series of LOCOS isolation regions and active area regions on both the source and drain sides of a respective line of floating gates. After forming the lines of floating gates and to provide a continuous line of essentially interconnected source regions, the substrate is masked to form an exposed area on the source side of the respective lines of floating gates. The LOCOS oxide is then selectively etched relative to the underlying substrate. This leaves a series of spaced trenches along the lines of floating gates the result of removal of oxide from the previously oxidized substrate which formed the LOCOS regions.

Non-recessed LOCOS in fabrication of FLASH memory in this manner is typically very shallow relative to the semiconductor substrate (i.e., less than 1500 Angstroms deep). This leaves a gradual, almost sinusoidal, undulating surface of exposed semiconductor substrate running in lines substantially parallel and immediately adjacent the lines of floating gates on the desired source side. With the gently sloping sidewalls of the trenches or recesses left by the LOCOS oxide removal, one or more source ion implant steps are conducted through the mask openings of the remaining photoresist layer. The result is formation of a continuously and conductively doped source line within the semiconductor substrate immediately adjacent the line of floating gates.

Circuitry fabrication and isolation of adjacent circuitry within a semiconductor substrate can also be achieved with a trench isolation that is different from LOCOS. For example, trenches can initially be etched within a semiconductor substrate and subsequently filled with an insulating material, such as high density plasma deposited oxide. Such trenches can and are sometimes made considerably deeper relative to the outer substrate surface as compared to the oxidation depth of LOCOS. Accordingly, the etching typically produces elongated, deeper and straighter sidewalls than LOCOS. When utilized in a FLASH memory fabrication process, such as described above, the result will be fabrication of discrete and disjointed source regions below the base of the trenches and in the plateaus or mesa areas of the active area therebetween. Thus, continuous source lines may not be formed in all instances.

The invention was motivated in overcoming this particular problem in FLASH memory cell fabrication associated with shallow trench and refill isolation. The artisan will, however, appreciate applicability of the invention in other areas, with the invention only being limited by the accompanying claims appropriately interpreted in accordance with the Doctrine of Equivalents.

SUMMARY OF INVENTION

The invention comprises FLASH memory and methods of forming flash memory. In one implementation, a line of floating gates is formed over a semiconductor substrate. The semiconductor substrate is etched to form a series of spaced trenches therein in a line adjacent and along at least a portion of the line of floating gates. At least one conductivity enhancing impurity implant is conducted into the semiconductor substrate at an angle away from normal to a general orientation of the semiconductor substrate to implant at least along sidewalls of the trenches and between the trenches, and a continuous line of source active area is formed within the semiconductor substrate along at least a portion of the line of floating gates.

In another implementation, a line of floating gates is formed over a semiconductor substrate. An alternating series of trench isolation regions and active area regions are provided in the semiconductor substrate in a line adjacent and along at least a portion of the line of floating gates. The series of active areas define discrete transistor source areas separated by trench isolation regions. A conductive line is formed over the discrete transistor source areas and trench isolation regions separating same adjacent and along at least a portion of the line of floating gates. The conductive line electrically interconnects the discrete transistor source areas. Source forming conductivity enhancing impurity is provided into the discrete transistor source areas.

Other implementations are contemplated.

BRIEF DESCRIPTION OF THE DRAWINGS

Preferred embodiments of the invention are described below with reference to the following accompanying drawings.

FIG. 1 is a diagrammatic top plan of a semiconductor wafer fragment in process in accordance with the invention.

FIG. 2 is a view of a semiconductor wafer fragment in process as positionally taken through line 2—2 in FIG. 1.

FIG. 5 is a view of the FIG. 2 wafer fragment at a processing step subsequent to that shown by FIG. 4.

FIG. 6 is a view of an alternate embodiment semiconductor wafer fragment as would positionally appear if taken through cut line 2—2 in FIG. 1.

FIG. 7 is a view of the FIG. 6 wafer fragment in a cut taken perpendicularly to that cut depicted by FIG. 6, and intermediate two trench isolation regions.

FIG. 8 is a view of a wafer fragment positionally corresponding to that of FIG. 7 exemplifying one exemplary fabrication step used in fabricating the wafer fragment of FIG. 7.

FIG. 9 is a view of the FIG. 8 wafer fragment at a processing step subsequent to that shown by FIG. 8.

DETAILED DESCRIPTION OF THE PREFERRED EMBODIMENTS

Figure 3:
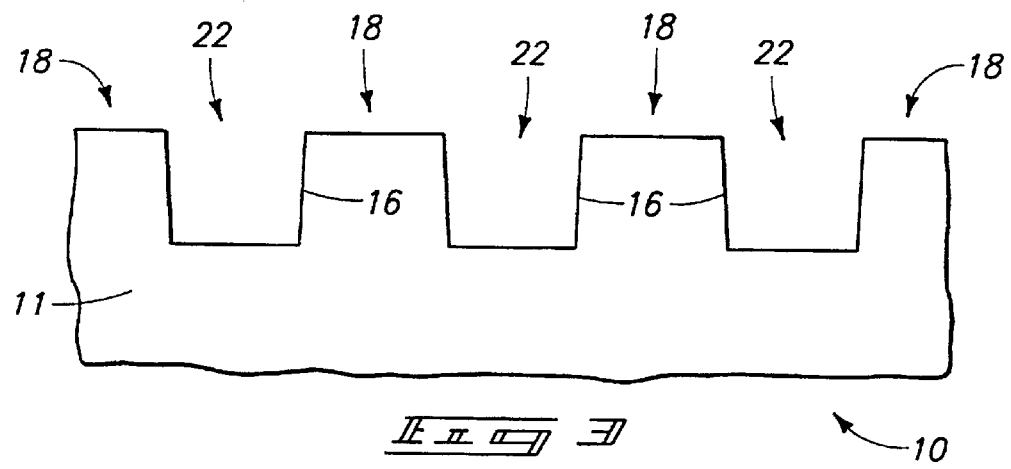
FIG. 3 is a view of the FIG. 2 wafer fragment at a processing step subsequent to that shown by FIG. 2.

This disclosure of the invention is submitted in furtherance of the constitutional purposes of the U.S. Patent Laws "to promote the progress of science and useful arts" (Article 1, Section 8).

Referring to FIG. 1, a portion of an array 10 of FLASH memory cells in fabrication is illustrated in top plan view. Such comprises a semiconductor substrate having lines of floating gates 12 and 14 formed thereover. In the context of this document, the term "semiconductor substrate" is defined to mean any construction comprising semiconductive material, including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure, including, but not limited to, the semiconductor substrates described above. As illustrated, semiconductor substrate 11 is in the form of a monocrystalline silicon substrate, although SOI and other constructions could also be utilized.

Referring to FIGS. 1 and 2, a series of spaced trenches 16 are etched into semiconductor substrate substantially perpendicular to floating gate word lines 12 and 14. Trenches 16 are preferably formed to be at least 2000 Angstroms deep, more preferably 3000 to 4000 Angstroms deep, and have sidewalls normal or within 10° of normal to the general substrate orientation. The area 18 between the trenches thereby comprises spaced lines of active area relative to substrate 11 running between spaced trenches 16. The illustrated sectional cut 2—2 in FIG. 1 is taken adjacent and parallel with lines of floating gates 12 and 14, and will constitute source active area for the respective transistors formed along lines of floating gates 12 and 14. Accordingly, FIGS. 1 and 2 can also be considered as depicting in a preferred embodiment an alternating series of trenches and active area regions provided in semiconductor substrate 11 in a line (i.e., line 2—2) running adjacent and along at least a portion of lines of floating gates 12 and 14. Active area regions 18 along that line, as depicted in FIG. 2, are thereby spaced or separated by trenches 16.

FIG. 2 illustrates trenches 16 having been filled with an insulating dielectric material 20, such as high density plasma deposited oxide, and subjected to a planarization step to provide a substantially planar outer surface. At this point in the process, such effectively forms an alternating series of trench isolation regions 22 and active area regions 18 in semiconductor substrate 11 running in a line adjacent and along lines of floating gates 12 and 14. The semiconductor wafer is typically and preferably fabricated to a point as would be depicted in FIG. 2, with the lines of floating gates being fabricated thereafter. Lines of floating gates 12 and 14 preferably constitute a gate dielectric layer (not shown), floating gate regions 23 (FIG. 1), an interpoly dielectric layer (not shown), a conductively doped polysilicon/silicide stack (not shown), and an insulative cap (not shown). (Such "not shown" items of this first described embodiments are shown in the embodiments of FIGS. 7–9.)

Drain and source implants in FLASH circuitry fabrication are typically separately conducted and optimized. Accordingly in a preferred implementation of this invention, drain implanting is next performed. A photoresist layer is ideally deposited and patterned to mask the floating gate word lines and source areas therebetween, and to leave the drain areas and isolation regions therebetween outwardly exposed. Exemplary drain areas 24 (FIG. 1) are accordingly left outwardly exposed within active area regions 18. One or more suitable implants are then provided to provide the desired depth and concentration of conductivity enhancing impurity to form the desired transistor drains within active areas 18 at locations 24.

The source regions for the respective floating gate transistors are preferably next fabricated. Specifically, a photoresist layer is preferably deposited and masked to cover the drain areas and lines of floating gates, yet leave the desired source regions exposed in lines running parallel and between the lines of floating gates on their source sides. Accordingly in the depicted FIG. 1 portion, the photoresist would be patterned to cover ideally all but the illustrated area comprising both active area and trench isolation regions running in a line between lines of floating gates 12 and 14. Referring to FIG. 3 and with such mask in place, isolation material 20 from FIG. 2 is removed from trenches 16 of trench isolation regions 22. Such removal preferably occurs by conventional oxide etching conducted substantially selective to the material of the semiconductor substrate 11, and is shown such that a majority of said insulating material is etched from the trenches, with such majority in the illustrated FIG. 3 embodiment constituting essentially the entirety of the isolation material previously received therewithin. In the depicted preferred embodiment, such removal from the trenches occurs through a mask opening provided immediately adjacent the line of floating gates along a continuous line of source active area being formed along at least a portion of the line of floating gates, with such area in the example comprising a line of source area for both lines of floating gates 12 and 14. Thus relative to the array, a series of spaced trenches 16 are provided within semiconductor substrate 11 adjacent and along at least a portion of the line of floating gates, in this example between floating gates 12 and 14.

Trench isolation material remains in trenches 16 beneath the lines of floating gates and on the drain sides thereof throughout the array. Preferably, trenches 16 are at least 2000 Angstroms deep, and preferably at least 3000 Angstroms deep, with the sidewalls extending along a line from an outer surface of the semiconductor substrate to the floor of the respective trenches, and being straight along a majority of the length of that line. This is understood to be contrary to the prior art LOCOS isolation wherein trenches left after etching of LOCOS field oxide along the source areas leaves trenches less than 2000 Angstroms deep and with largely curved sidewalls. In accordance with one aspect of the invention, suitable conductivity enhancing impurity is implanted into the semiconductor substrate to beneath the trenches, along sidewalls of the trenches, and between the trenches, and forming therefrom a continuous line of source active area within the semiconductor substrate along at least a portion of the line of floating gates. Several implementations are considered in accordance with the invention and as may be impacted by trench depth and shape, or other processing concerns.

Figure 4:
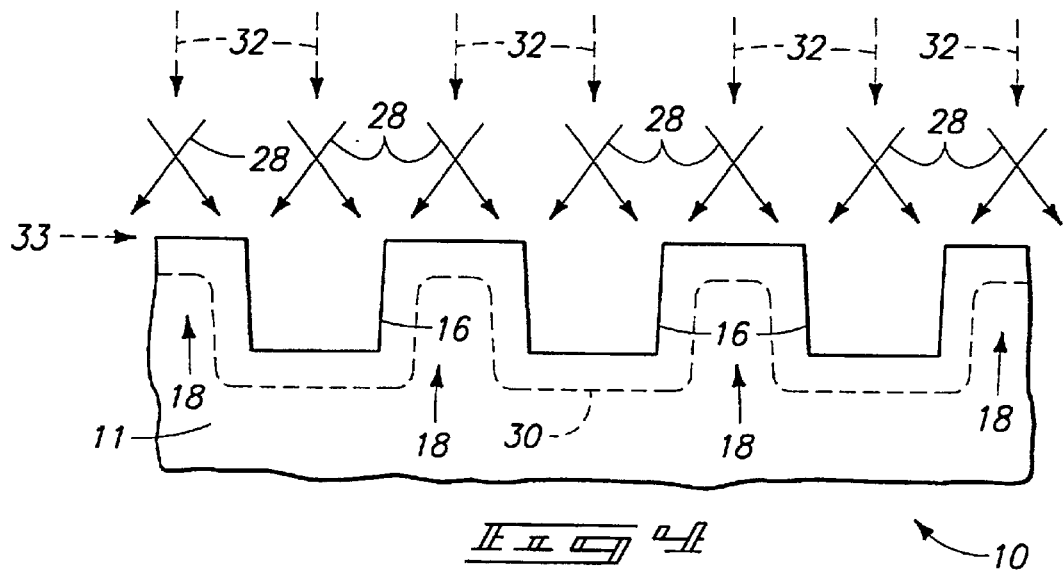
FIG. 4 is a view of the FIG. 2 wafer fragment at a processing step subsequent to that shown by FIG. 3.

Consider for example FIG. 4. In accordance with one implementation, at least one conductivity enhancing impurity implant is conducted into semiconductor substrate 11 at an angle away from normal (arrows 32) to a general orientation (i.e., along line 33) of the semiconductor substrate. Such is depicted by arrows 28 which are illustrated as being other than perpendicular to a general orientation of the substrate such as depicted by the generally planar outer surface of the substrate of FIG. 2. In one implementation, such will implant at least along sidewalls of trenches 16 and between the trenches in active areas 18. If the implant angle is suitably close to normal, and depending upon the aspect ratio of trenches 16, such may result in a continuous line 30 of implanted source active area within semiconductor substrate 11 along and between lines of floating gates 12 and 14. In some instances, the trenches may be effectively deep to preclude forming a continuous implant region at bases of the trenches from a desired angled implant. Accordingly in such and other instances, an implementation of the invention further comprises conducting at least one conductivity enhancing impurity implant into the semiconductor substrate at an angle normal to the general orientation of the semiconductor substrate. Such is depicted by arrows 32 in FIG. 4. Accordingly, multiple implants of the same or different impurities can be conducted relative to the same or different angles in accordance with the invention.

Another preferred embodiment incorporating implementations of the invention is described with reference to FIG. 5. Like numerals from the first-described embodiment have been utilized where applicable, with differences being indicated by the suffix "a" or with different numerals. Here, spaced trenches 16*a* are fabricated to comprise sidewall 17 having portions thereof angled at least 150 from a direction 32 normal to a general orientation of semiconductor substrate 11. More preferably, sidewall portions are angled at greater than 15° from normal, such as at least 20° from normal, at least 30° from normal, and at least 40° from normal. Such angling of sidewalls of etched trenches may enable one or more desired source-forming implants to be conducted only at an angle normal (along line 32) to the general orientation of the semiconductor substrate. Alternately and more preferred however, ion implanting with respect to the embodiment of FIG. 5 includes multiple implants conducted both normal and at an angle away from normal in the circuitry fabrication to form a continuously running source line 30*a*. Such is believed to produce a more homogenous implant along the length of continuous source line being formed. Example implantings include both phosphorus at a dose from 1–3 E15 ions/cm$^2$, energy at 30–70 keV, and arsenic at a dose from 0.5–3 E14 ions/cm$^2$, energy at 20–60 keV. An insulative spacer layer in either of the above-described embodiments would thereafter be deposited to produce insulating spacers (not shown) about the drain and source sides of the lines of floating gates.

Another implementation is described with reference to FIGS. 6–7. Like numerals from the first-described embodiment are utilized where appropriate, with differences being indicated with the suffix "b" or with different numerals. FIG. 6 is a sectional view or cut corresponding to that of FIG. 2, and depicts processing occurring subsequent to that of FIG. 2. Accordingly, an array 10*b* in accordance with this particular preferred embodiment is processed initially to the point as depicted in FIG. 2 in the first-described embodiment. A series of alternating trench isolation regions 22 and active areas 18 are thereby provided within semiconductor substrate 11 in a line adjacent and along at least a portion of lines of floating gates 12 and 14. Such defines a series of discrete transistor source areas separated by trench isolation regions. Floating gate word line patterning thereafter occurs, followed by drain region formation as described above. Lines of floating gates 12 and 14 as depicted in FIG. 7 (as well as in FIGS. 8 and 9 described subsequently) comprise a gate dielectric layer, floating gate regions 23 formed thereover, an interpoly dielectric layer formed over floating gate regions 23, a conductively doped polysilicon/silicide stack formed over the interpoly dielectric layer, and an insulative cap (having an outermost surface) formed over the conductively doped polysilicon/silicide stack.

Ultimately, a conductive line 40 is formed over the discrete transistor source areas within active area 18 and over trench isolation regions 22 along at least a portion of lines of floating gates 12 and 14. Further ultimately, source forming conductivity enhancing impurity is implanted into the discrete transistor source areas forming implant regions 30*b*. Accordingly, the FIGS. 6 and 7 embodiment differs from that of the previously described embodiments in that isolation material remains within the trenches along the source region running substantially parallel with the respective lines of floating gates. Conductive line 40 electrically interconnects the discrete transistor source areas 18/30*b*, and preferably comprises conductively doped semiconductive material 38 (i.e., polysilicon) capped with a conductive silicide layer 39. Other conductive materials could also of course be utilized for line 40.

The FIGS. 6 and 7 construction could be fabricated in any of a number of manners. Further, alternate embodiments to that depicted in FIGS. 6 and 7 are of course contemplated, with the invention only being limited by the accompanying claims appropriately interpreted in accordance with the Doctrine of Equivalents. In one implementation, processing can occur as described in the first-described embodiment to the point of forming a source line mask opening in a layer of photoresist along and between lines of floating gates 12 and 14. Further, the patterning of the lines of floating gates is preferably such that the illustrated bottom gate dielectric layer 43 is not etched in initially forming the lines. Desired ion implanting of a source forming impurity is conducted through the source line mask openings. Implanting occurring within regions 20 is of no consequence. Further, gate dielectric material overlying the source areas is etched away through the source line mask openings.

The photoresist is subsequently stripped, and an electrically insulative spacer forming layer is deposited over the entirety of the wafer. Such is ideally comprised of a different material than gate dielectric layer 43 of lines 12 and 14. Circuitry peripheral to the array is then preferably masked such that the entirety of the array remains open. Spacers for the lines of floating gates within the array, such as the depicted spacers 42 in FIG. 7 and having an outermost surface which is substantially elevationally coincident with the insulative cap outermost surface, are then formed by anisotropic etching to electrically isolate the sides of the lines of floating gates. Such preferably does not occur yet in the periphery which is why it is masked, as the preferred subsequently deposited polysilicon would otherwise result in polysilicon on monocrystalline silicon in the preferred embodiment over the peripheral transistor and other circuitry active areas. Unetched material 43 over drain locations 24 will separate monocrystalline silicon from polysilicon in this example embodiment. Alternately, if the peripheral gates are also initially formed such that the bottom gate dielectric layer is not etched and comprises a material different from the spacer layer, this material will separate polysilicon from monocrystalline silicon such that masking of the spacer forming layer in the periphery is immaterial.

The photoresist would then be stripped, and conductively doped polysilicon and silicide or refractive metal thereafter globally deposited over the substrate. Such would subsequently be patterned to produce the exemplary illustrated line 40 of FIG. 7. Such patterning and etch with leaving the spacer layer unetched in the periphery circuitry provides a convenient etch stop to remove the source strapping polysilicon/silicide layer outwardly of the array. Such processing as compared to the first-described embodiment does, however, require at least two additional masks in a first mask for the periphery during the spacer etch and in a second subsequent mask in formation of source strapping lines 40. Further, in this and the subsequent described embodiment, conductivity enhancing impurity provided within semiconductive material layer 38 can out diffuse into the discrete transistor source areas, thereby facilitating formation of source regions 30b within the active areas.

Consider now yet another exemplary implementation 10c for fabrication of the FIG. 7 and other embodiments as described with reference to FIGS. 8 and 9. Like numerals from the third-described embodiment are utilized where appropriate, with differences being indicated with the suffix "c" or with different numerals. In this embodiment, fabrication occurs to a point of word line formation and drain implant as in the immediately above described embodiment. Yet in this one example, the gate dielectric layer is patterned with the initial patterning of lines 12 and 14. Then, an insulative sidewall forming layer 46 is deposited over the wafer and lines of floating gates. A layer of photoresist 48 is then deposited and patterned to only expose the source sides of the lines of floating gates, as shown.

Referring to FIG. 9, insulative sidewall spacers 42 are formed on the source sides of lines of floating gates 12 and 14 by anisotropically etching insulative sidewall forming layer 46. More broadly considered, an insulative sidewall spacer is formed on one of the=source side or the drain side of the line of floating gates before the other sidewall spacer on the opposing side is formed. In this particular embodiment, the source side insulative spacer is shown being formed before the drain side (not shown in FIG. 9), although the reverse could also occur. In another considered aspect of the invention, in one anisotropic etching step of the insulating sidewall forming layer, an insulative sidewall spacer is formed on only one of the source side and the drain side, and not the other, as depicted by example in FIG. 9. In another anisotropic etching step, an insulative sidewall spacer can be formed on the opposing drain side. Alternately, no insulative sidewall spacer is ever formed on the opposing drain side.

In accordance with the preferred aspect of the FIG. 9 depicted embodiment, ion implanting is conducted before removing photoresist layer 48 to provide conductivity enhancing impurity implant 30c into the respective active area source regions. Subsequently, the photoresist is stripped and the conductive line forming material, preferably conductively doped semiconductive material, is deposited and patterned to form lines 40 (FIG. 7). Alternately but less preferred, the source implanting with respect to the construction of FIG. 9 can be eliminated, with source forming implant being totally relied upon by out-diffusion of conductivity enhancing impurity from the deposited doped semiconductive material of the line forming layer. As alluded to above, subsequent processing may or may not form spacers on the drain side of the floating gates, for example commensurate with or separately from forming spacers in connection with the peripheral circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method at forming a line of FLASH memory cells comprising:

forming a line of floating gates over a semiconductor substrate;

providing an alternating series of trench isolation regions and active area regions in the semiconductor substrate in a line adjacent and along at least a portion of the line of floating gates, the series of active areas defining discrete transistor source areas separated by trench isolation regions, the trench isolation regions comprising isolation trenches having insulating dielectric material received therein;

forming a conductive line over the discrete transistor source areas and over the insulating dielectric material received within the isolation trenches adjacent and along at least a portion of the line of floating gates, the conductive line electrically interconnecting said discrete transistor source areas; and providing source forming conductivity enhancing impurity into the discrete transistor source areas.

2. The method of claim 1 wherein a majority of the source forming impurity is provided before forming the conductive line.

3. The method of claim 1 wherein a majority of the source forming impurity is provided commensurate with or after forming the conductive line.

4. The method of claim 1 comprising providing the series of trench isolation regions before forming the line of floating gates.

5. The method of claim 1 wherein the conductive line comprises conductively doped polysilicon capped with a conductive silicide layer.

6. A method of forming a line of FLASH memory cells comprising:

forming a line of floating gates over a semiconductor substrate;

providing an alternating series of trench isolation regions and active area regions in the semiconductor substrate in a line adjacent and along at least a portion of the line of floating gates, the series of active areas defining discrete transistor source areas separated by trench isolation regions;

forming conductively doped semiconductor material over the discrete transistor source areas and trench isolation regions separating same adjacent and along at least a portion of the line of floating gates which electrically interconnects said discrete transistor source areas;

out diffusing source forming conductivity enhancing impurity into the discrete transistor source areas from the conductively doped semiconductor material; and patterning the conductively doped semiconductor material into a conductive line.

7. The method of claim 6 wherein the conductively doped semiconductor material is capped with a conductive silicide layer.

8. The method of claim 6 wherein the conductively doped semiconductor material is capped with a conductive silicide layer prior to the patterning.

9. A method of forming a line of FLASH memory cells comprising:

forming a line of floating gates over a semiconductor substrate, the line of floating gates having a source side and a drain side, the line of floating gates having an insulative cap having an outermost surface;

depositing an insulative sidewall forming layer over the line of floating gates; and in one anisotropic etching step of the insulative sidewall forming layer, forming an insulative sidewall spacer on only the drain side and not on the source side by masking the source side with masking material during the one anisotropic etching step, the insulative sidewall spacer having an outermost surface which is substantially elevationally coincident with the insulative cap outermost surface.

10. A method of forming a line of FLASH memory cells comprising:

forming a line of floating gates over a semiconductor substrate, the line of floating gates having a source side and a drain side, the line of floating gates having an insulative cap having an outermost surface;

depositing an insulative sidewall forming layer over the line of floating gates;

in one anisotropic etching step of the insulative sidewall forming layer, forming a first insulative sidewall spacer on only one of the source side and the drain side and not the other by masking the other with masking material during the one anisotropic etching step, the first insulative sidewall spacer having an outermost surface which is substantially elevationally coincident with the insulative cap outermost surface;

further comprising in another anisotropic etching step, forming a second insulative sidewall spacer on the other side, the second insulative sidewall spacer having an outermost surface which is substantially elevationally coincident with the insulative cap outermost surface; and wherein the line of floating gates is formed over channel active area of the semiconductor substrate, the forming of the line of floating gates comprising providing a gate dielectric layer intermediate floating gate material and the channel active area, the forming of the line of floating gates comprising initially etching through the gate dielectric layer on both of the source side and the drain side, the first insulative sidewall spacer having an innermost surface which is received on semiconductive material of the semiconductor substrate, the second insulative sidewall spacer having en innermost surface which is received on semiconductive material of the semiconductor substrate.

11. The method of claim 9 wherein no insulative sidewall spacer is ever formed on the source side.

12. The method of claim 10 wherein the one side is the source side.

13. The method of claim 10 wherein the one side is the drain side.

14. The method of claim 1 wherein the isolation trenches are filled with said insulating dielectric material.

15. The method of claim 1 wherein the conductive line has a substantially planar outermost surface.

16. The method of claim 1 wherein the conductive line has a substantially planar innermost surface.

17. The method of claim 1 wherein the conductive line has a substantially planar outermost surface and a substantially planar innermost surface.

18. The method of claim 8 wherein the trench isolation regions comprise isolation trenches having insulating dielectric material received therein and the conductive line is formed over the insulating dielectric material received within the isolation trenches.

19. The method of claim 18 wherein the isolation trenches are filled with said insulating dielectric material.

20. The method of claim 8 wherein the conductive line has a substantially planar outermost surface.

21. The method of claim 8 wherein the conductive line has a substantially planar innermost surface.

22. The method of claim 8 wherein the conductive line has a substantially planar outermost surface and a substantially planar innermost surface.

23. The method of claim 9 wherein the semiconductor substrate comprises monocrystalline silicon.

24. The method of claim 1 wherein the line of floating gates is formed over channel active area of the semiconductor substrate and is formed to have a source side and a drain side, the farming of the line of floating gates comprising providing a gate dielectric layer intermediate floating gate material and the channel active area, the forming of the line of floating gates comprising initially etching through the gate dielectric layer on the source side and not on the drain side.

25. The method of claim 2 wherein the line of floating gates is formed over channel active area of the semiconductor substrate and is formed to have a source side and a drain side, the forming of the line of floating gates comprising providing a gate dielectric layer intermediate floating gate material and the channel active area, the forming of the line of floating gates comprising initially etching through the gate dielectric layer on the source side and not on the drain side.

26. The method of claim 3 wherein the line of floating gates is formed over channel active area of the semiconductor substrate and is formed to have a source side and a drain side, the forming of the line of floating gates comprising providing a gate dielectric layer intermediate floating gate material and the channel active area, the forming of the line of floating gates comprising initially etching through the gate dielectric layer on the source side and not on the drain side.

27. The method of claim 6 wherein the line of floating gates is formed over channel active area of the semiconductor substrate and is formed to have a source side and a drain side, the forming of the line of floating gates comprising providing a gate dielectric layer intermediate floating gate material and the channel active area, the forming of the line of floating gates comprising initially etching through the gate dielectric layer on the source side and not on the drain side.

28. The method of claim 9 wherein the line of floating gates is formed over channel active area of the semiconductor substrate, the forming of the line of floating gates comprising providing a gate dielectric layer intermediate floating gate material and the channel active area, the forming of the line of floating gates comprising initially etching through the gate dielectric layer on both of the source side and the drain side, the insulative sidewall spacer on the drain side having an innermost surface which is received on semiconductive material of the semiconductor substrate.

* * * * *

UNITED STATES PATENT AND TRADEMARK OFFICE
CERTIFICATE OF CORRECTION

PATENT NO. : 6,713,346 B2
DATED : March 30, 2004
INVENTOR(S) : Graham Wolstenholme It is certified that error appears in the above-identified patent and that said Letters Patent is hereby corrected as shown below:

Title page,
Item [57], ABSTRACT,
Line 2, replace "forming flash memory. In one implementation, a line of" with
-- forming FLASH memory. In one implementation, a line of --

Column 30,
Line 31, replace "FIG. 1 is a diagrammatic top plan of a semiconductor" with
-- FIG. 1 is a diagrammatic top plan view of a semiconductor --

Column 6,
Line 10, replace "having portions thereof angled at least 150 from a direction" with
-- having portions thereof angled at least 15° from a direction --

Column 8,
Line 15, replace "spacer is formed on one of the=source side or the drain side" with
-- spacer is formed on one of the source side or the drain side --
Line 57, replace "A method at forming a line of FLASH memory cells" with -- A method of forming a line of FLASH memory cells --

Column 10,
Line 31, replace "insulative sidewall spacer having en innermost surface" with
-- insulative sidewall spacer having an innermost surface --

Signed and Sealed this

Seventh Day of December, 2004

JON W. DUDAS
*Director of the United States Patent and Trademark Office*